(12) United States Patent  
van Schravendijk et al.

(10) Patent No.: US 7,396,759 B1
(45) Date of Patent: Jul. 8, 2008

(54) PROTECTION OF CU DAMASCENE INTERCONNECTS BY FORMATION OF A SELF-ALIGNED BUFFER LAYER

(75) Inventors: Bart van Schravendijk, Sunnyvale, CA (US); Thomas W Mountsier, San Jose, CA (US); Mahesh K Sanganeria, Sunnyvale, CA (US); Glenn B Alers, Scots Valley, CA (US); Roey Shaviv, Palo Alto, CA (US)

(73) Assignee: Novellus Systems, Inc., San Jose, CA (US)

( * ) Notice: Subject to any disclaimer, the term of this patent is extended or adjusted under 35 U.S.C. 154(b) by 231 days.

(21) Appl. No.: 10/980,076

(22) Filed: Nov. 3, 2004

(51) Int. Cl.
  *H01L 21/4763* (2006.01)
(52) U.S. Cl. .................. 438/625; 438/627; 438/687; 257/E21.575
(58) Field of Classification Search ......... 438/622–629, 438/631, 633, 635, 641, 687, 637–638; 257/E21.575, 257/E21.579
See application file for complete search history.

(56) References Cited

U.S. PATENT DOCUMENTS

| 6,143,657 | A | 11/2000 | Liu et al. | |
| 6,181,013 | B1 * | 1/2001 | Liu et al. | 257/762 |
| 6,271,595 | B1 * | 8/2001 | McGahay et al. | 257/762 |
| 6,821,890 | B2 | 11/2004 | McGahay et al. | |
| 6,869,873 | B2 | 3/2005 | Bradshaw et al. | |
| 7,060,619 | B2 * | 6/2006 | Cowley et al. | 438/687 |
| 2006/0046479 | A1 | 3/2006 | Rajagopalan et al. | |

FOREIGN PATENT DOCUMENTS

JP    2000-252278    *    9/2000

* cited by examiner

*Primary Examiner*—Thanhha Pham
(74) *Attorney, Agent, or Firm*—DeLio & Peterson, LLC

(57) ABSTRACT

Methods of protecting exposed metal damascene interconnect surfaces in a process for making electronic components and the electronic components made according to such methods. An integrated circuit structure having damascene regions with exposed metal surfaces is provided into a closed processing chamber, whereby a first reactant is contacted to the exposed metal surfaces to transform a top portion of the metal layer into a protective self-aligned buffer layer. Reacting molecules of the first reactant with metal atoms of this metal layer forms the protective self-aligned buffer layer entirely within such metal layer. Alternatively, adsorbing surface-active reactant molecules onto the exposed metal surface forms the protective self-aligned buffer layer. A second reactant may be contacted to the protective self-aligned buffer layer to form a self-aligned dielectric cap layer directly over the protective self-aligned buffer layer.

15 Claims, 5 Drawing Sheets

PROTECTION OF CU DAMASCENE INTERCONNECTS BY FORMATION OF A SELF-ALIGNED BUFFER LAYER

BACKGROUND OF THE INVENTION

1. Field of the Invention

This invention relates to the making of electronic components such as integrated circuit semiconductor devices having electrical interconnection structures within the component and, more particularly, to a self-aligned protective buffer layer over copper damascene interconnects.

2. Description of Related Art

In semiconductor fabrication processes, layers of insulating, conducting and semiconducting materials are commonly deposited and patterned to form integrated circuits (ICs). Contact vias, i.e., openings, are also commonly formed in insulating materials known as interlevel dielectrics (ILDs). These vias are filled with conductive material to interconnect electrical devices and wiring at various levels.

Damascene and dual damascene processing similarly involve etching openings to define wiring patterns and contacts in multiple layers of insulating dielectric layers for electrically connecting metallization in one layer to metallization in another layer. In single damascene processing, construction of each interconnect level involves separate patterning and filling of vias (or contacts) and trenches. Dual damascene processing involves patterning both the vias (or contacts) and trenches for each level prior to filling such damascene regions with metallization. These damascene wiring and contact patterns are then filled with a metal using a filling technique such as electroplating, electroless plating, chemical vapor deposition, physical vapor deposition or a combination of methods. This process is often followed by planarization to remove excess metal material, such as by chemical mechanical polishing.

Recent semiconductor device manufacturing techniques use copper (Cu) as a wiring material, particularly in devices having small feature sizes, due to copper's low resistivity and high resistance to electro-migration. However, copper is often difficult to pattern and use for metal wiring as it is easily oxidized when exposed to air. Oxidation of copper interconnects undesirably increases the resistance of the wiring pattern. Damascene wiring is frequently used for copper interconnection technology whereby trenches and via openings are formed in the insulating dielectric layer and then filled with copper. Chemical mechanical polishing (CMP), or an etch-back process, then planarizes this conductive copper fill to expose the dielectric layer. As a result, the damascene metal wiring pattern remains in the damascene regions and the insulating dielectric layers provide electrical insulation and electrical isolation between the copper wiring elements. However, the damascene copper wiring patterns may still be exposed to air, and thus, be subjected to oxidation. With time and temperature, these oxides ultimately corrode the copper to result in formation of voids in the copper conductor, which are detrimental to the integrated circuit (IC) device and must be avoided.

To avoid both oxidation of the copper and metal diffusion between the copper wiring elements and the insulating dielectric layers, barrier layers are often included in the structure. Barrier layers contain the copper or other metal and provide improved adhesion of the copper lines and vias to the dielectric or other metallization. Cu damascene interconnects require the barrier layers to be deposited in two separate steps. The first deposition is done prior to Cu fill of the patterned damascene trenches and/or vias and is typically a refractory metal such as Ta or TaN that is formed in the via and trench on the sidewalls, trench floor, and at the base of the via. It presents a barrier to the diffusion of metal between the copper filled via and trench and the dielectric, as well as a barrier between such copper metal and the metallization of the underlying or overlying conductor wiring levels. The second barrier deposition is done after Cu CMP (or etchback) and typically coats the exposed Cu surface with dielectric material (such as $SiN_x$ and $SiC_x$).

However, it has been found that in copper damascene interconnection structures, the most likely point of failure during line current stress (electromigration) is this copper to dielectric barrier interface. Whereas the electromigration resistance of copper is high enough to sustain the wear-out in normally designed conductor lines, defect-induced electromigration failures have been observed at the interface between the copper and dielectric barrier layer. For instance, wherein copper oxides or hydroxides have been undesirably formed at such interfaces, voids will be formed in the copper layer, which hamper the electromigration characteristics of such copper interconnection. Understandably, current density in these regions is considerably high during actual use, thereby causing early field fails due to defect sensitive electromigration failure.

Further, in damascene processing, prior to barrier deposition and/or depositing metal layers within via and/or via/trench interconnections, a pre-clean step is essential. However, in so doing, underlying copper layers exposed at a bottom of the damascene via and/or via/trench are exposed to air, which forms copper oxides on such surfaces.

Thus, despite repeated efforts, and various schemes in the prior art, manufacturing problems due to defect sensitive electromigration failure and corrosion remain. Better methods for making copper integrated circuit patterns with improved reliability and reduced defect sensitivity need to be developed.

SUMMARY OF THE INVENTION

Bearing in mind the problems and deficiencies of the prior art, it is therefore an object of the present invention to provide a method for fabricating high performance interconnection circuitry with improved process yield and reliability.

It is another object of the present invention to reduce defect sensitivity of copper interconnect metallurgy by improving its electromigration resistance.

A further object of the invention is to provide a method of forming a protective layer over a copper line that reduces electromigration failure of the interconnect line.

Still another object of the invention is to provide a method of forming and a protective cap or buffer layer over a copper line for improving the electromigration resistance of such interconnect line.

It is yet another object of the present invention to provide a method of buffering copper lines which does not affect the metal line integrity.

Still other objects and advantages of the invention will in part be obvious and will in part be apparent from the specification.

The above and other objects, which will be apparent to those skilled in art, are achieved in the present invention, which is directed to a method for protecting exposed metal damascene interconnect surfaces in a process for making electronic components. The method includes providing an integrated circuit structure, which is in the process of being fabricated into a finished electronic component. This integrated circuit structure has a damascene region with an exposed metal surface of a metal layer. A first reactant is contacted to the exposed metal surface, whereby upon contact, a top portion of the exposed metal surface is transformed into a protective self-aligned buffer layer. This is accomplished by reacting molecules of the first reactant with metal atoms of the metal layer such that the protective self-aligned buffer layer is formed entirely within the metal layer.

In the invention, the metal layer may be either exposed at a bottom of the damascene region, whereby the protective self-aligned buffer layer is formed just prior to depositing a diffusion barrier layer therein, or it may be a metal fill within the damascene region, whereby the protective self-aligned buffer layer is formed in such metal fill as a final step of a CMP process. In both instances, the integrated circuit structure is preferably initially preheated to a temperature ranging from about 20° C. to about 500° C.

The protective self-aligned buffer layer is formed within the metal layer under processing conditions including gas flow rates of about 0.001 sccm to about 10,000 sccm, temperatures of about 20° C. to about 500° C., and pressures of about 10 mTorr to about 100 Torr. It is preferably formed to a depth ranging from about 10 Å to about 1,000 Å into the metal layer. Wherein the metal layer is a copper layer within damascene regions, the first reactant may be $SiH_4$, $GeH_4$, $PH_3$, $B_2H_6$, $AsH_3$, $CH_4$, or $C_xH_y$ to form a protective self-aligned buffer layer, such as $Cu-Si_x$, $Cu-Ge_x$, $Cu-P_x$, $Cu-B_x$, $Cu-As_x$, or $Cu-C_x$.

In this aspect of the invention, the method may further include contacting a second reactant to the protective self-aligned buffer layer, whereby molecules of the second reactant react with molecules of the protective self-aligned buffer layer to form a self-aligned dielectric cap layer. This self-aligned dielectric cap layer is preferably formed to a thickness ranging from about 1 Å to about 100 Å, and may be formed directly over the protective self-aligned buffer layer, within such buffer layer, or a combination thereof. This second reactant may be a gas, such as, $N_2$, $NH_3$, $CH_4$, $C_2H_4$, $C_2H_2$, $C_xH_y$, a gas from the family of methyl-substituted silanes, or a gas from the family of methyl-substituted amines and HMDS.

In accordance with the invention, the protective self-aligned buffer layer, and the optional self-aligned dielectric cap layer, may be formed within a single chamber of a closed processing system under a continuous vacuum, that is absent any oxygen, to form a homogeneous transition layer, or alternatively, it may be formed sequentially within multiple chambers of such closed processing system to form a continuous graded transition layer.

In another aspect, the invention is directed to another method for protecting exposed metal damascene interconnect surfaces in a process for making electronic components. This method includes providing an integrated circuit structure, which is in the process of being fabricated into a finished electronic component. This integrated circuit structure has a damascene region with an exposed metal surface of a metal layer. A surface-active reactant is contacted to the exposed metal surface, whereby excited molecules of the surface-active reactant react with metal atoms of the metal layer. These reaction molecules are then adsorbed onto the exposed metal surface to form a protective self-aligned buffer layer.

In still other aspects, the invention is directed to electronic components made according to the methods described above.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1A-8 of the drawings in which like numerals refer to like features of the invention.

Figure 1A:
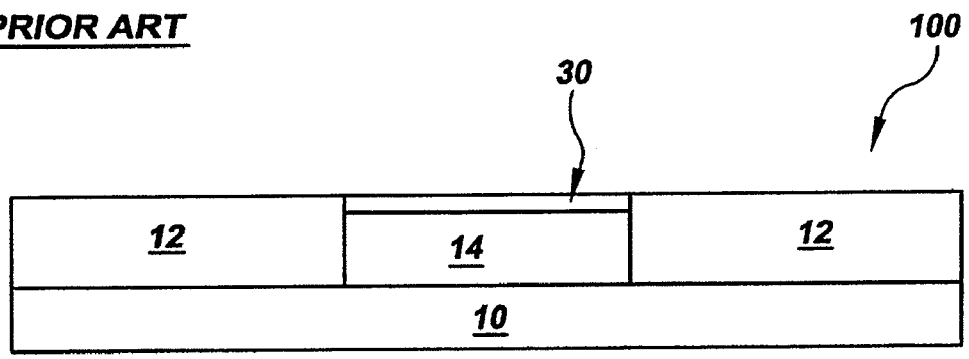
FIG. 1A is a prior art illustration showing a cross sectional view of a copper damascene interconnect layer having an undesirable oxide layer formed thereon.

FIG. 1A shows structure 100 having a single damascene metal interconnect for forming an integrated circuit device. A first dielectric layer 12 is provided over a substrate layer 10. The dielectric layer 12 may include a material such as $SiO_2$, $SiN_x$, $SiC_x$, fluorinated silicon glass (FSG), phosphosilicate glass (PSG), low-k dielectrics like SiLK, carbon doped oxides and the like, while the substrate layer 10 may include a material such as silicon, $SiN_x$, $SiC_x$, or an etch-stop layer above an underlying Cu/Al interconnect level. The dielectric layer may be deposited by known techniques including chemical vapor deposition (CVD) processes, sputtering or spin-on processes for organics.

Figure 1B:
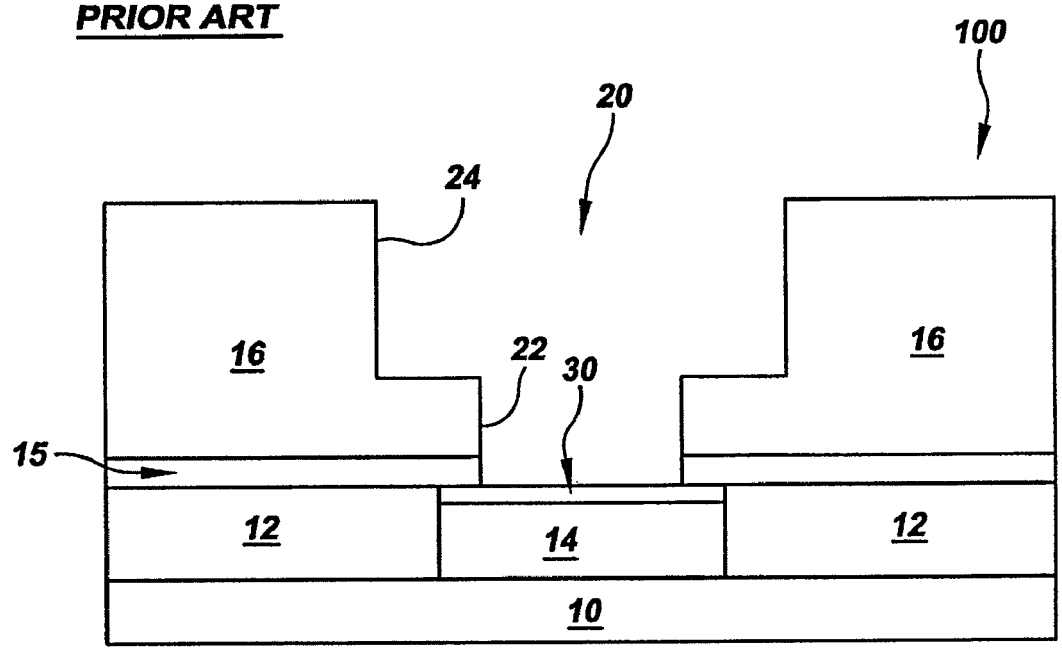
FIG. 1B is a prior art illustration showing a dielectric diffusion barrier layer and a dual damascene region formed over the structure of FIG. 1A whereby a weak interface exists between the interconnect top surface and the dielectric diffusion barrier layer due to the presence of undesirable oxide layer or poor interfacial bonding between the interconnect and the dielectric diffusion barrier.

Dielectric layer 12 contains a metal layer 14, preferably a copper layer 14, formed therein by known techniques. A dielectric diffusion barrier layer 15 is formed over the structure and then a second dielectric layer 16 is provided over the dielectric diffusion barrier layer 15. As shown in FIG. 1B, a dual damascene interconnect region 20 having via opening 22 and a connecting trench opening 24 is formed in the second dielectric layer 16 such that metal layer 14 having undesirable oxides formed thereon is exposed. Upon exposure of the metal layer 14 to the ambient environment, oxidation occurs between exposed portions of the metal and the air to form a metal oxide layer 30, such as copper oxide layer, over such exposed portions of metal layer 14, as is shown in FIGS. 1A-B.

This undesirable oxide layer is one of the problems to which this invention is addressed as oxides form voids in the underlying copper layer 14, weakens adhesion to the dielectric diffusion barrier layer 15 and undesirably increases the resistance of the copper wiring pattern. Thus, it is a purpose of the invention to prevent or substantially eliminate the formation of copper oxides prior to proceeding with further IC fabrication steps, such as barrier and seed layer deposition followed by metallization of the damascene regions. In instances where copper oxides reside or have been formed on the copper layer, these copper oxides may be used to modulate the chemical reaction for forming a protective self-aligned cap or buffer layer of the invention. The invention further solves the problems of electromigration and weak adhesion associated with the weak copper/dielectric interface, while not sacrificing copper resistivity.

For ease of understanding the invention, the drawings refer to the dielectric layer 16 having a dual damascene interconnect, however it should be appreciated that the present invention is useful for single damascene interconnect regions, dual damascene interconnect regions, and even combinations thereof.

The present invention is shown in FIGS. 2A-8, which illustrate a protective self-aligned cap or buffer layer 40 formed only at locations of exposed portions of metallization residing within dielectric. For instance, the protective self-aligned buffer layer 40 may be formed only at locations of exposed copper layer 14 residing within metal layer 14 (FIGS. 2A-4), at locations of exposed copper fill 28 within dual damascene regions, or even combinations thereof (FIGS. 5-8).

Wherein the protective self-aligned buffer layer is formed at locations of exposed copper layer 14, it is preferably formed just prior to deposition of a dielectric diffusion barrier layer 15. The processing conditions are preferably in a closed environment under a continuous vacuum such that the exposed copper layer 14 is not exposed to the ambient environment, i.e., oxygen. Alternatively, or in combination therewith, the self-aligned buffer layer of the invention may also be formed after metal layer 28 has been deposited or filled within dual damascene regions, as the final step of a chemical mechanical polish (CMP) process of such metal layer 28. An essential feature of the invention is that by forming the protective self-aligned buffer layer 40 only at locations of exposed metal layers, this protective buffer layer is self-aligned to such metal layers.

The protective self-aligned buffer layer 40 is formed by providing the structure 100 having exposed copper regions within a closed multichamber processing system. This closed multichamber processing system is preferably under a continuous vacuum such that it is void of oxygen. The closed multichamber processing system preferably has a variety of processing chambers, each being sealable from one another and each chamber being adapted to operate and run under varying processing conditions. A critical feature is that the closed multichamber processing system must be capable of depositing a variety of reactants at different temperatures, since optimal temperatures are essential for each step of forming the protective self-aligned buffer layer of the invention. For instance, a suitable closed multichamber processing tool for use with the instant invention is a Vector® CVD chamber, a Concept One® CVD chamber, or a Sequel® tool for manufacturing semiconductors, all of Novellus Systems, of San Jose, Calif.

Figure 2A:
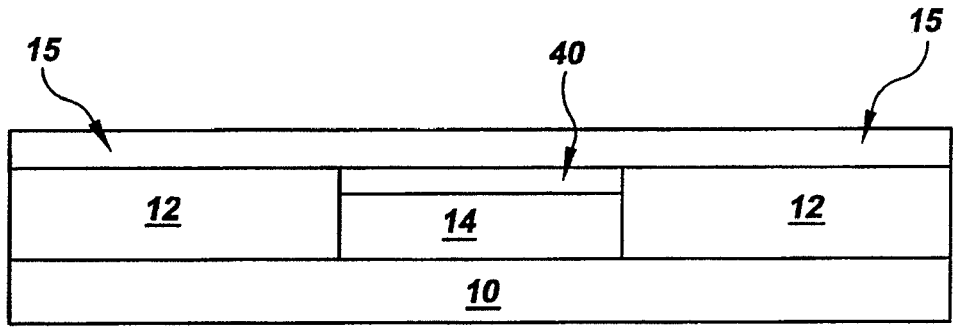
FIG. 2A is a cross sectional view showing the protective self-aligned buffer layer of the invention formed within a copper damascene interconnect layer, and having a dielectric diffusion barrier layer formed thereover.

Referring to FIGS. 2A-4, the structure of FIG. 2A is provided within the closed multichamber processing system for exposing the metal layer 14, preferably exposed copper layer 14. Once the metal layer 14 is exposed, the protective self-aligned buffer layer 40 of the invention is immediately forming directly within the metal layer 14, without breaking the continuous closed system. This is accomplished by cleaning the structure surfaces using any known cleaning technique, preheating the structure to a temperature ranging from about 20° C. to about 500° C., and then exposing the metal layer 14 to a first reactant gas or vapor.

The first reactant gas or vapor is then flown into the processing chamber at a flow rate ranging from about 0.001 sccm to about 10,000 sccm, preferably from about 1 sccm to about 100 sccm, and under temperatures ranging from about 20° C. to about 500° C., preferably from about 150° C. to about 250° C. Other processing conditions within the processing chamber include a pressure range of about 10 mTorr to about 100 Torr, and a power input range (in the case of a plasma discharge) of about 1 Watt to about 1,000 Watts per processing station. The reactant gas or vapor may include, but is not limited to, $SiH_4$, $GeH_4$, $PH_3$, $B_2H_6$, $AsH_3$, $CH_4$, or any hydrocarbon reactant of the formula $C_xH_y$, and the like. An essential feature is that since the processing chamber is under a continuous vacuum, exposure of the copper layer 14 to oxygen is avoided, and thus, copper oxides are prevented from forming thereon.

Figure 3:
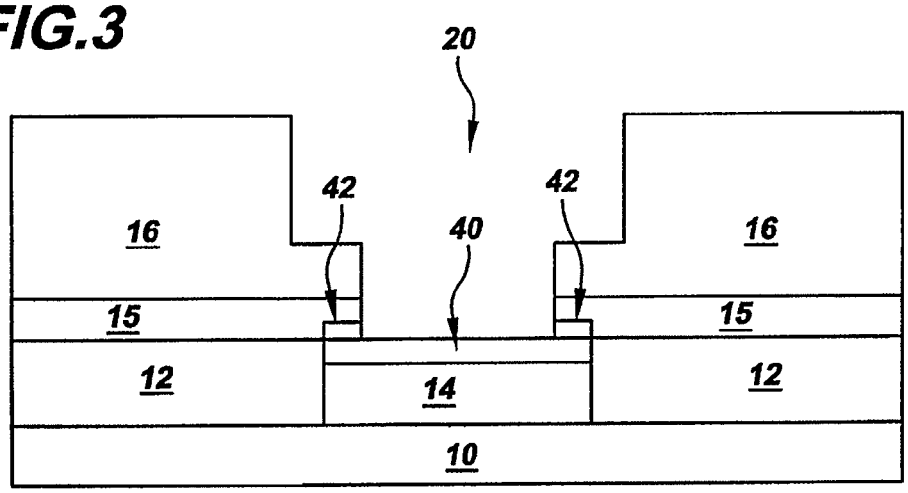
FIG. 3 is a cross sectional view of FIG. 2C showing a dielectric cap layer of the invention formed above the protective self-aligned buffer layer and covered by the dielectric diffusion barrier layer.
Figure 4:
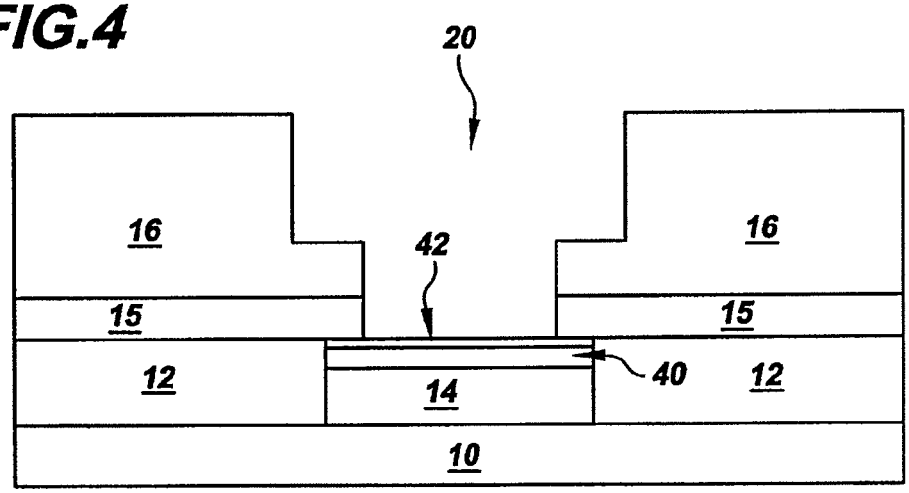
FIG. 4 is a cross sectional view of FIG. 2C showing a dielectric cap layer of the invention formed within the protective self-aligned buffer layer.
Figure 5:
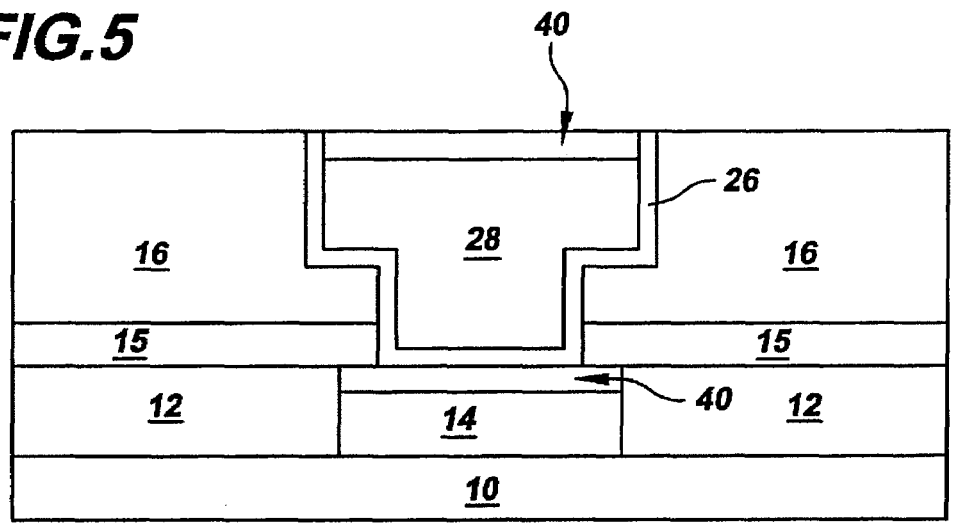
FIG. 5 is a cross sectional view of FIG. 2C showing a conductive barrier layer deposited directly over the protective self-aligned buffer layer and the dual damascene region filled with metallization, whereby another protective self-aligned buffer layer of the invention may be formed only within such metallization.
Figure 6:
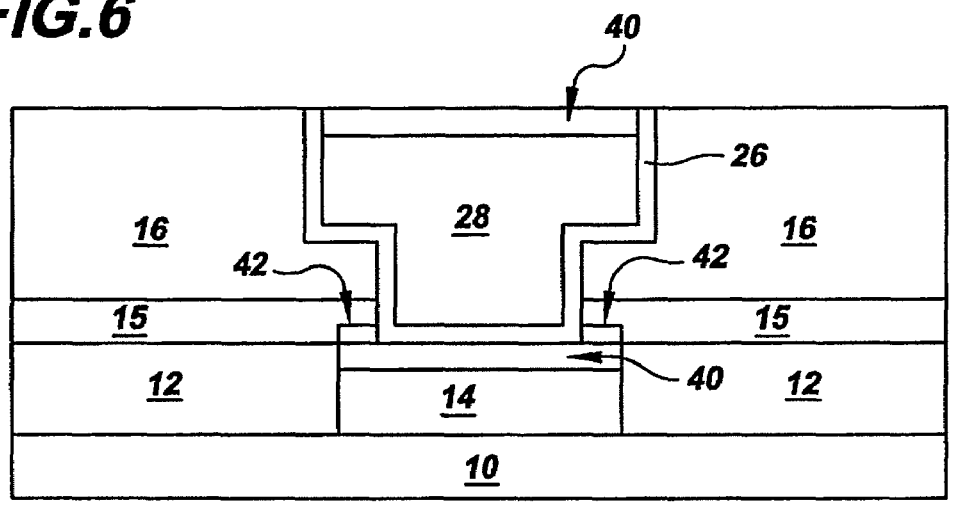
FIG. 6 is a cross sectional view of FIG. 3 showing a conductive barrier layer deposited directly over the dielectric cap layer and the damascene region filled with metallization, whereby another protective self-aligned buffer layer of the invention may be formed only within such metallization.

Upon introduction of the first reactant into the chamber, this reactant gas is excited, either by plasma discharge or thermally, whereby once in contact with the exposed surface of the metal layer 14, excited reactant molecules react in-situ with metal atoms of the metal layer 14, preferably copper atoms of the copper layer 14. This in-situ chemical reaction between excited reactant molecules and metal atoms at the exposed metal layer surface transforms a top portion of such exposed metal layer 14 to the metal alloy buffer layer 40 of the invention. That is, the metal alloy protective buffer layer 40 is advantageously formed directly within the metal layer 14, in a manner that does not add any substantial height to such metal layer 14 (as shown in FIGS. 2-4), and as such, it is self-aligned to the metal layer 14. The metal alloy protective buffer layer 40 may be formed to a depth ranging from about 10 Å to about 1,000 Å within the metal layer 14. A thick metal alloy protective buffer layer (e.g., a buffer layer thicker than about 1,000 Å) extending into metal layer 14 is undesirable as it may deleteriously affect resistivity of such metal layer 14. In the preferred embodiment, wherein the metal layer 14 is a copper layer, excited reactant gaseous or vapor molecules react with copper atoms in the copper layer 14 to form a copper alloy protective self-aligned buffer layer, including, but not limited to, Cu—Si$_x$, Cu—Ge$_x$, Cu—P$_x$, Cu—B$_x$, Cu—As$_x$, Cu—C$_x$, and the like, directly within the copper layer 14 itself.

At this point, the dielectric diffusion barrier layer 15 may be formed directly over the metal alloy protective self-aligned buffer layer 40 (as discussed below and shown in FIGS. 2A-C, 5 and 8), or alternatively, the metal alloy protective self-aligned buffer layer 40 may be further processed. In the event the metal alloying process results in an excessive line resistivity increase, a dielectric cap layer 42 is formed directly over the metal alloy protective self-aligned buffer layer 40.

Referring to FIGS. 3, 4 and 6-8, in forming the dielectric cap layer 42, the IC may be moved to another chamber within the multichamber processing tool and a second reactant gas or a gaseous mixture is flown into such chamber. This second reactant gas, or gaseous mixture, may include, but is not limited to, $N_2$, $NH_3$, $CH_4$, $C_2H_4$, $C_2H_2$, $C_xH_y$, a gas or gaseous mixture from the family of methyl-substituted silanes, such as $SiH_x(CH_3)_{4-x}$, a gas or gaseous mixture from the family of methyl-substituted amines, such as $NH_x(CH_3)_{3-x}$, and HMDS. It is flown into the second processing chamber at a flow rate ranging from about 0.01 sccm to about 50,000 sccm, preferably from about 100 sccm to about 10,000 sccm, and under temperatures ranging from about 20° C. to about 500° C., preferably from about 250° C. to about 400° C. The dielectric cap layer 42 may include, but is not limited to, $SiN_x$, $SiC_x$, $SiCN_x$, amorphous C:H, and the like.

The second reactant is excited, either by plasma discharge or thermally, whereby upon contact with the metal alloy self-aligned buffer layer 40, excited second reactant molecules react in-situ with these metal alloy molecules. In so doing, this in-situ chemical reaction may either react with metal alloy molecules at a top surface of the metal alloy protective self-aligned buffer layer 40 to form and deposit the dielectric cap layer 42 directly over the metal alloy buffer layer 40 (see, FIGS. 3 and 6), it may react with such top surface metal alloy molecules such that it converts or transforms a top portion of the metal alloy protective self-aligned buffer layer 40 into the dielectric cap layer 42 (see, FIGS. 4 and 7), or even combinations thereof (see, FIG. 8). This dielectric cap layer 42 may be formed over the metal alloy self-aligned buffer layer 40 to a thickness ranging from about 1A to about 100 Å, it may be formed directly within the metal alloy self-aligned buffer layer 40 to a depth ranging from about 1 Å to about 100 Å from a planar surface of such buffer layer 40, or it may be formed to a combination thereof.

That is, the dielectric cap layer 42 may both add additional thickness to the buffer layer 40, as well as be formed within such buffer layer. Preferably, the dielectric cap layer 42 is formed within the metal alloy protective self-aligned buffer layer 40 such that the buffer layer 40 maintains a smooth planar surface to avoid any subsequent problems in further processing the integrated circuit.

Figure 2B:
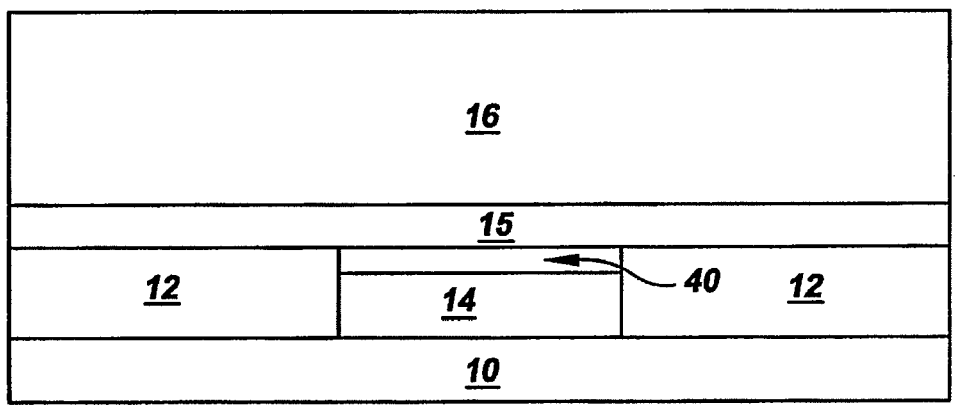
FIG. 2B is a cross sectional view of FIG. 2A showing a dielectric layer formed over the dielectric diffusion barrier layer.
Figure 2C:
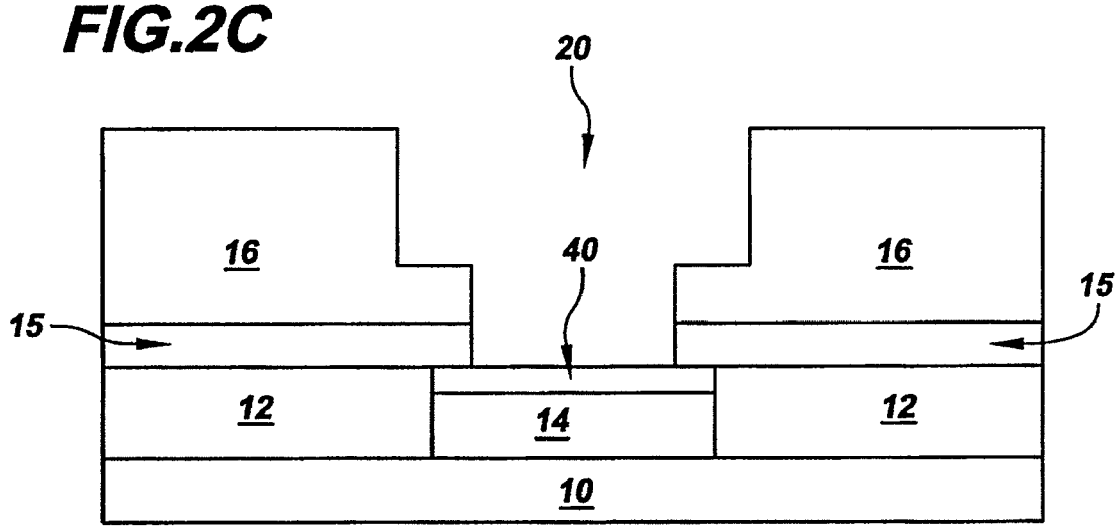
FIG. 2C is a cross sectional view of FIG. 2B showing a dual damascene region formed in the dielectric layer to expose a portion of the protective self-aligned buffer layer of the invention formed within the copper damascene interconnect layer.

Referring to FIGS. 2A-C, the dielectric diffusion barrier layer 15 may then be deposited over the structure immediately after forming the metal alloy self-aligned buffer layer 40 of the invention. The second dielectric layer 16 is formed thereover, and a dual damascene region 20 formed in the second dielectric layer 16. Exposed metal alloy self-aligned buffer layer 40 within metal layer 14 resides at the bottom of this dual damascene region 20. Alternatively as shown in FIGS. 3 and 4, the dielectric cap layer 42 may be formed directly over the metal alloy self-aligned buffer layer 40 followed by deposition of the dielectric diffusion barrier layer 15. In this aspect, wherein the dielectric cap layer 42 is formed over the metal alloy self-aligned buffer layer 40 (FIG. 3), the dielectric diffusion barrier layer 15 is deposited directly over and covers the dielectric cap layer 42, whereby once the dual damascene region is formed, metal alloy self-aligned buffer layer 40 residing in metal layer 14 is exposed at the bottom of such damascene region, while only portions of the dielectric cap layer 42 remain. If, however, the dielectric cap layer 42 is formed within the metal alloy self-aligned buffer layer 40 (FIG. 4), upon formation of the dual damascene region, dielectric cap layer 42 residing in metal alloy self-aligned buffer layer 40, which in turn is within the metal layer 14, is exposed at the bottom of such dual damascene regions.

Figure 8:
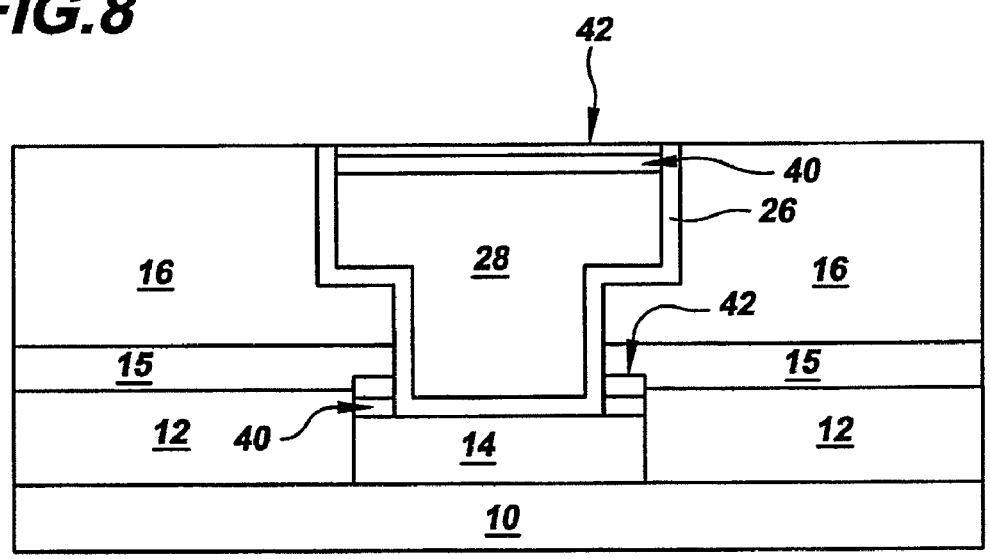
FIG. 8 is a cross sectional view of FIG. 2C showing two protective self-aligned buffer layers of the invention formed within the interconnect structure with a dielectric cap layer being formed within the protective self-aligned buffer layer residing in metallization filling the dual damascene region.

Referring to FIG. 8, wherein the dielectric cap layer 42 is formed both above and within the metal alloy self-aligned buffer layer 40, portions of such dielectric cap layer 42 remain and are covered by the dielectric diffusion barrier layer 15, as well as portions of the dielectric cap layer 42 would be exposed at the bottom of the dual damascene region.

The dielectric diffusion barrier layer 15 is preferably deposited over the protective self-aligned buffer layer 40 or dielectric cap layer 42 without breaking vacuum. This may be accomplished by depositing the barrier layer 15 over such layers within a single chamber, or two separate chambers, of the multichamber tool without breaking vacuum. It is especially advantageous to deposit the dielectric diffusion barrier layer 15 over the protective self-aligned buffer layer 40 or dielectric cap layer 42 without breaking vacuum when the dielectric diffusion barrier layer 15 is a low k dielectric diffusion barrier that is non-hermetic since the protective self-aligned buffer layer 40 or dielectric cap layer 42 can reduce the impact of penetration of atmospheric contaminants such as, for example, $H_2O$ and $O_2$, to the copper layer 14 surface. The self-aligned buffer layer 40 also prevents electromigration of copper atoms from the copper layer 14 into the barrier layer 26, as well as significantly improves adhesion therebetween such copper layer and barrier layer.

Thus, in accordance with the invention, when forming the metal alloy self-aligned buffer layer 40, dielectric cap layer 42 and dielectric diffusion barrier layer in multiple chambers within the closed system under constant vacuum, a continuous graded transition layer is formed from the copper layer 14 to the dielectric diffusion barrier layer 15 with compositions transitioning in continuing fashion. This continuous graded transition layer includes in sequence metal layer 14, to metal alloy self-aligned buffer layer 40, to dielectric cap layer 42, to dielectric diffusion barrier layer 15, thereby improving adhesions therebetween such layers and avoiding electromigration problems even further, particularly between the copper layer and the dielectric diffusion barrier layer.

Alternatively, the dielectric cap layer 42 of the invention may be formed in a single processing chamber within the multichamber tool. In so doing, the first reactant gas is flown into the processing chamber under the above discussed processing conditions for forming the metal alloy self-aligned buffer layer 40. The flow rate of this first reactant is then ramped down to zero, while the second reactant is simultaneously flown into the processing chamber until the second reactant is the only gas being provided within the processing chamber. Simultaneously, the temperatures within this single chamber are also altered to adjust to the appropriate processing conditions for forming the metal alloy self-aligned buffer layer 40 and then the dielectric cap layer 42 as discussed above. Under these conditions, a continuous transition layer is formed that includes metal layer, to metal alloy self-aligned buffer layer, to metal alloy self-aligned buffer-cap layer, to dielectric cap layer and then to the dielectric diffusion barrier layer, thereby improving adhesion and avoiding electromigration problems still further.

As an alternate approach, the protective self-aligned buffer layer of the invention may be formed by molecule adsorption of a surface-active agent only over exposed metal layer surfaces. These surface-active agents may be in a gaseous or liquid phase. Wherein the surface-active agent is a gas, an appropriate gaseous material may be selected to form a self-aligned dielectric cap layer or a self-aligned metal buffer layer. Gases include, but are not limited to, HMDS, a gas or gas mixture from the family of methyl-substituted silanes, or a gas or gas mixture from family of methyl-substituted amines, are capable of forming the self-aligned dielectric cap layer of the invention. Alternatively, the self-aligned metal buffer layer may be formed using metal/metal surface-active gases including metallo organic precursors for forming metal or metal nitride layers such as, for example, Ti, TiN, Ta, TaN, W, WNi, and the like.

Using a gaseous surface-active agent, the protective self-aligned buffer layer is formed by flowing the surface-active agent gas into the processing chamber at a flow rate of about 0.001 sccm to about 10,000 sccm and under temperatures ranging from about 20° C. to about 500° C. Molecules of the surface-active agent adsorb only onto exposed metal layer surfaces, preferably exposed surfaces of copper layers 14 and 28. In order to ensure selective adsorption of metal from a metal/metal surface-active gas, copper layers 14 and 28 may need to be precleaned. These adsorbed molecules are excited, either by plasma discharge or thermally, such that the excited surface-active agent molecules react in-situ with atoms of the metal layers 14, 28 to form the protective self-aligned buffer layer of the invention, which may be either a dielectric layer or a metal layer. In this aspect, the protective self-aligned buffer layer may be formed above metal layers 14, 28 to a thickness of about 10 Å to about 1,000 Å, within such metal layers 14, 28 (as discussed above) to a depth of about 200 Å, or combinations thereof.

Wherein the surface-active agent is in a liquid phase, the surface-active liquid may include, but is not limited to, aqueous $I_2$, HMDS and the like, to form the protective metal alloy self-aligned buffer layer 40 of the invention, which may include, for example, $CuI_x$, $Cu-N-Si(CH_3)_x$, $Cu-Si(CH_3)_x$, and the like. Adsorption of the liquid phase surface-active agents may be accomplished as a final step of the CMP process or as a part of the post-CMP clean process, preferably at temperatures ranging from about 0° C. to about 100° C. In so doing, the metal layer 28 is polished back so that a metal wiring pattern is exposed at a surface of the damascene regions. This exposed metal layer 28 is then treated in accordance with the invention with the liquid phase surface-active agent to activate metal atoms of such exposed metal layer 28 and transform a top portion of the exposed metal layer 28 into the protective self-aligned buffer layer 40 of the invention.

Figure 7:
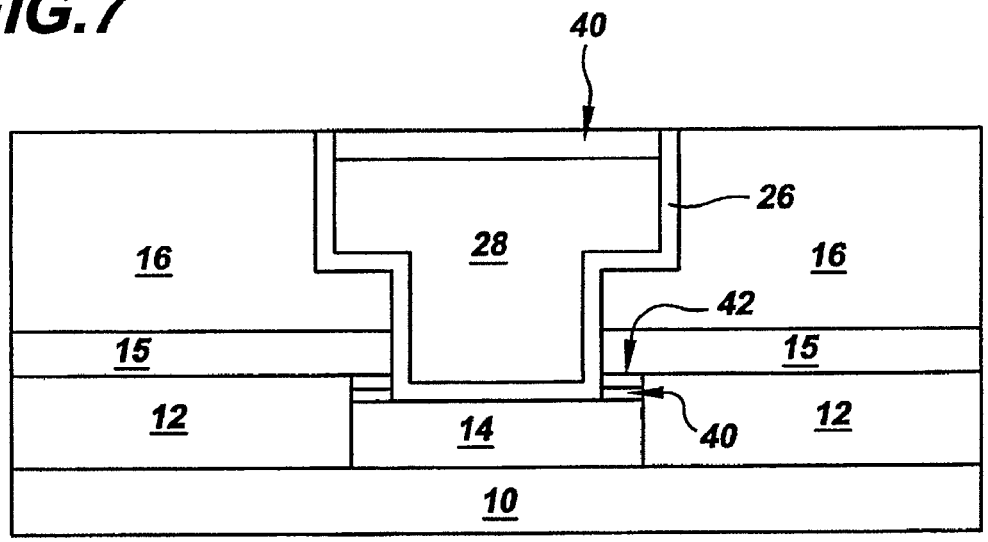
FIG. 7 is a cross sectional view of FIG. 4 showing a conductive barrier layer deposited directly over the dielectric cap layer and the damascene region filled with metallization, whereby another protective self-aligned buffer layer of the invention may be formed only within such metallization.

Referring to FIGS. 5-8, once the protective self-aligned buffer layer 40, and optional dielectric cap layer 42, are formed only at locations corresponding to exposed metal layers, and the dielectric diffusion barrier layer 15 has been deposited followed by formation of dual damascene regions 20 within dielectric layer 16, a conductive barrier (liner) layer 26 may then be deposited within such dual damascene regions. In so doing, the conductive barrier layer 26 is deposited directly over the protective self-aligned buffer layer 40 (FIGS. 5 and 6), or it may be deposited directly over or into the metal layer 14 (FIGS. 7 and 8). This conductive barrier layer 26 is deposited on sidewalls of via opening 22 and trench opening 24. The barrier layer may include, but is not limited to, Ti, Ta, W, TaN, TiN, $WN_2$, SiN, TaSiN, WSiN, TiSiN, SiC, SiBN and the like, deposited at higher temperatures ranging from about −50° C. to about 400° C., to a thickness ranging from about 20 Å to about 1,000 Å.

Once conductive barrier (liner) layer 26 is deposited, the damascene regions 20 are filled with metallization. This may be accomplished by depositing a metallic seed layer over the barrier layer 26, followed by electroplating to fill the damascene regions. The seed layer may comprise a material that initiates plating such as, for example, copper, aluminum, tungsten, silver, nickel and the like, while the damascene regions 20 are filled with copper, aluminum, tungsten, silver, nickel and the like, by electroplating. In the preferred embodiment, both the seed layer and metal fill 28 are copper. Alternatively, the damascene regions may be filled with metal fill 28 by chemical vapor deposition, physical vapor deposition, electroless plating (which does not require a seed layer) or any other suitable method.

Upon completion of metallization fill, the metal layer 28 is planarized, such as by CMP, to the surface of dielectric layer 16 for removing any excess conductive copper material and providing a planar surface of the structure for forming an integrated circuit device. As discussed in detail above, and as shown in FIGS. 5-8, at this point of the invention the protective self-aligned buffer layer 40, and optionally the dielectric cap layer 42, may be formed in the metallization fill 28 as the final step of the CMP process.

EXAMPLE

Formation of a $CuSi_x$/SiN protective self-aligned buffer layer 40/dielectric cap layer 42 may be accomplished using the following steps:

Station 1: Providing a structure 100 having exposed copper layer 14 into a first chamber of a multichamber processing tool, wherein such structure is cleaned followed by heating the structure to a temperature ranging from about 20° C. to about 500° C.

Station 2: The cleaned, preheated structure is then moved into a second chamber under a continuous vacuum, wherein $SiH_4$ is flown into such chamber at a rate ranging from about 1 sccm to about 100 sccm, under temperatures ranging from about 150° C. to about 250° C., and pressures range of about 10 mTorr to about 100 Torr. $SiH_4$ molecules react with copper atoms at a top portion of the copper layer 14 to transform such top copper layer portion to a $CuSi_x$ protective self-aligned buffer layer 40 within the copper layer 14. This process forms $CuSi_x$, while avoiding Si diffusion, with insignificant resistance shift of the copper layer.

Station 3: The structure is then moved to a third chamber within the closed processing chamber, while still under a continuous vacuum, wherein a $NH_3$ is flown into such chamber at a rate of about 100 sccm to about 10,000 sccm, and under temperatures ranging from about 250° C. to about 400° C. $NH_3$ treatment molecules react with $CuSi_x$ molecules at a top portion of the $CuSi_x$ buffer layer 40 to form a SiN dielectric cap layer 42. This SiN dielectric cap layer 42 may reside within the $CuSi_x$ buffer layer 40, on top of such $CuSi_x$ buffer layer 40, or both reside within and above the $CuSi_x$ buffer layer. Wherein the protective self-aligned buffer layer 40 is dielectric, this process bakes out amines adsorbed into such dielectric self-aligned buffer layer to reduce resist poisoning.

Station 4: The structure is moved to a fourth chamber, while still under a continuous vacuum, wherein the dielectric diffusion barrier layer 15 is formed directly over the SiN dielectric cap layer 42 within the damascene regions.

In accordance with the invention, the protective self-aligned buffer layer 40 advantageously reduces electromigration failure between metal and dielectric layers, in particular, between copper layer 14 and dielectric diffusion barrier layer 15, as well as between copper fill 28 and any dielectric layer subsequently deposited thereover. In order to be effective, the protective self-aligned buffer layer has a higher resistivity, preferably from about 5 to 10 times higher, than the metal layer within which it resides to force metal atom migration flow in a direction away from any weak metal to dielectric barrier interface regions. In so doing, the protective self-aligned buffer layer preferably has a minimal thickness within such metal layer so that it insignificantly raises the overall resistivity of the metal wiring patterns. Another advantage of the protective self-aligned buffer layer of the invention is that it improves adhesion between metal and dielectric layers, which further improves prevention of migration of metal atoms during current stress. The invention is particularly useful for solving electromigration and adhesion problems associated with copper-to-dielectric interfaces, while not sacrificing copper resistivity.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for protecting exposed metal interconnect surfaces in a process for making electronic components comprising:
   providing an integrated circuit structure which is in the process of being fabricated into a finished electronic component having an exposed metal surface of a metal layer;
   contacting a first reactant to said exposed metal surface, said first reactant selected from the group consisting of $SiH_4$, $CH_4$, and $C_xH_y$;
   transforming a top portion of said exposed metal surface into a protective self-aligned buffer layer by reacting molecules of said first reactant with metal atoms of said metal layer such that said protective self-aligned buffer layer is formed entirely within said metal layer;
   contacting a second reactant to said protective self-aligned buffer layer, said second reactant comprising an excited gas selected from the group consisting of $N_2$, $NH_3$, $CH_4$, $C_2H_4$, $C_2H_2$, $C_xH_y$, a gas from the family of methyl-substituted silanes, a gas from the family of methyl-substituted amines and HMDS; and
   transforming a top portion of said protective self-aligned buffer layer into a self-aligned dielectric cap layer selected from the group consisting of $SiN_x$, $SiC_x$, $SiCN_x$, and amorphous C:H by reacting molecules of said second reactant with molecules of said protective self-aligned buffer layer.

2. The method of claim 1 wherein said metal layer is within a damascene region of said integrated circuit structure.

3. The method of claim 2 wherein said self-aligned dielectric cap layer is formed just prior to depositing a dielectric diffusion barrier layer over all surfaces of said integrated circuit structure.

4. The method of claim 2 further including the steps:
   said integrated circuit structure having a dual damascene region;
   said self-aligned dielectric cap layer being exposed at a bottom of said dual damascene region;
   filling said dual damascene region with metallization;
   forming a second protective self-aligned buffer layer within said metallization fill of said dual damascene region; and
   transforming a top portion of said second protective self-aligned buffer layer into a second self-aligned dielectric cap layer.

5. The method of claim 1 wherein said protective self-aligned buffer layer is formed within said metal fill as a final step of chemically mechanically polishing said metal fill.

6. The method of claim 1 further including, just prior to said step of contacting said first reactant to said exposed metal surface, preheating said integrated circuit structure to a temperature ranging from about 20° C. to about 500° C.

7. The method of claim 1 wherein said protective self-aligned buffer layer is formed to a depth ranging from about 10 Å to about 1,000 Å into said metal layer.

8. The method of claim 7 wherein said self-aligned dielectric cap layer is formed to a thickness ranging from about 1 Å to about 100 Å.

9. The method of claim 1 wherein said protective self-aligned buffer layer is formed within said metal layer under processing conditions comprising a first reactant gas flow rate ranging from about 0.001 sccm to about 10,000 sccm, a temperature ranging from about 20° C. to about 500° C., and a pressure range of about 10 mTorr to about 100 Torr.

10. The method of claim 1 wherein said metal layer is a copper layer.

11. The method of claim 10 wherein said protective self-aligned buffer layer is selected from the group consisting of Cu—$Si_x$, and Cu—$C_x$.

12. The method of claim 1 wherein said self-aligned dielectric cap layer is formed directly over said protective self-aligned buffer layer.

13. The method of claim 1 wherein said self-aligned dielectric cap layer is formed entirely within said protective self-aligned buffer layer.

14. The method of claim 1 wherein said protective self-aligned buffer layer is formed in a closed processing system under a continuous vacuum and absent any oxygen.

15. The method of claim 1 wherein said self-aligned dielectric cap layer is formed both over and within said protective self-aligned buffer layer.

* * * * *

UNITED STATES PATENT AND TRADEMARK OFFICE
CERTIFICATE OF CORRECTION

PATENT NO. : 7,396,759 B1
APPLICATION NO. : 10/980076
DATED : July 8, 2008
INVENTOR(S) : van Schravendijk et al.

It is certified that error appears in the above-identified patent and that said Letters Patent is hereby corrected as shown below:

At column 6, line 3, "closed multichamber. processing system" should read -- closed multichamber processing system --.

At column 7, line 43, "IA" should read -- 1Å --.

At column 8, line 41, "diffusion barrier layer" should read -- diffusion barrier layer 15 --.

Signed and Sealed this

Twenty-first Day of October, 2008

JON W. DUDAS
*Director of the United States Patent and Trademark Office*